(12) United States Patent
Zhan

(10) Patent No.: US 12,382,816 B2
(45) Date of Patent: Aug. 5, 2025

(54) DISPLAY DEVICE

(71) Applicant: Wuhan China Star Optoelectronics Semiconductor Display Technology Co., Ltd., Hubei (CN)

(72) Inventor: Dong Zhan, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 49 days.

(21) Appl. No.: 17/622,882

(22) PCT Filed: Dec. 20, 2021

(86) PCT No.: PCT/CN2021/139818
§ 371 (c)(1),
(2) Date: Dec. 27, 2021

(87) PCT Pub. No.: WO2023/108697
PCT Pub. Date: Jun. 22, 2023

(65) Prior Publication Data
US 2024/0040893 A1     Feb. 1, 2024

(30) Foreign Application Priority Data
Dec. 13, 2021   (CN) .......................... 202111521722.8

(51) Int. Cl.
*B32B 3/30* (2006.01)
*B32B 5/18* (2006.01)
(Continued)

(52) U.S. Cl.
CPC .............. *H10K 59/80* (2023.02); *B32B 3/30* (2013.01); *B32B 5/18* (2013.01); *B32B 7/12* (2013.01);
(Continued)

(58) Field of Classification Search
None
See application file for complete search history.

(56) References Cited

U.S. PATENT DOCUMENTS

2012/0163023 A1* 6/2012 Kim ..................... G02B 6/0091
                                                        362/611
2012/0264345 A1* 10/2012 Yoon .................... G02F 1/1339
                                                        445/25
(Continued)

FOREIGN PATENT DOCUMENTS

CN         108034373        5/2018
CN         109343254        2/2019
(Continued)

OTHER PUBLICATIONS

International Search Report and the Written Opinion Dated Sep. 15, 2022 From the International Searching Authority Re. Application No. PCT/CN2021/139818 and Its Translation Into English. (17 Pages).

(Continued)

*Primary Examiner* — Bilkis Jahan

(57) ABSTRACT

A display device includes a display panel, a back plate positioned at a side of the display panel, and a composite functional layer positioned at a side of the back plate facing away the display panel. A micro structure is positioned at an edge of at least one of the display panel, the back plate and the composite functional layer. This could increase the pinning effect and the adhesive effect between the display panel, the back plate and the composite functional layer to avoid the peeling phenomenon between the display panel, the back plate and the composite functional layer during the dissembling and maintenance process. Accordingly, the dissembling and maintenance yield of the display device is raised and the cost is reduced.

19 Claims, 4 Drawing Sheets

(51) Int. Cl.
  *B32B 7/12* (2006.01)
  *B32B 15/08* (2006.01)
  *B32B 17/06* (2006.01)
  *B32B 27/06* (2006.01)
  *B32B 27/28* (2006.01)
  *B32B 27/36* (2006.01)
  *H10K 59/80* (2023.01)

(52) U.S. Cl.
  CPC .............. *B32B 15/08* (2013.01); *B32B 17/06* (2013.01); *B32B 27/065* (2013.01); *B32B 27/281* (2013.01); *B32B 27/36* (2013.01); *B32B 2250/05* (2013.01); *B32B 2307/4023* (2013.01); *B32B 2307/42* (2013.01); *B32B 2457/206* (2013.01)

(56) References Cited

U.S. PATENT DOCUMENTS

| | | | | |
|---|---|---|---|---|
| 2015/0009634 A1* | 1/2015 | Hsu | ............................ | G09F 9/33 361/748 |
| 2016/0147109 A1* | 5/2016 | Yamazaki | .............. | H10K 71/50 257/40 |
| 2016/0268546 A1* | 9/2016 | Lee | ............................ | B32B 5/18 |
| 2017/0150575 A1* | 5/2017 | Ka | ........................ | G06F 1/1601 |
| 2021/0066419 A1 | 3/2021 | Byun et al. | | |
| 2023/0354565 A1* | 11/2023 | Yin | ........................ | B32B 37/22 |

FOREIGN PATENT DOCUMENTS

| | | | | |
|---|---|---|---|---|
| CN | 110488538 | | 11/2019 | |
| CN | 112967606 | | 6/2021 | |
| CN | 113054132 | | 6/2021 | |
| CN | 113066361 | * | 7/2021 | ............. G09F 9/301 |
| CN | 113284930 | | 8/2021 | |
| CN | 214847489 | | 11/2021 | |
| CN | 112396964 | | 2/2023 | |

OTHER PUBLICATIONS

Notification of Office Action and Search Report Dated Jan. 12, 2023 From the State Intellectual Property Office of the People's Republic of China Re. Application No. 2011115217220.8 and Its Translation Into English. (20 Pages).

* cited by examiner

DISPLAY DEVICE

RELATED APPLICATIONS

This application is a National Phase of PCT Patent Application No. PCT/CN2021/139818 having International filing date of Dec. 20, 2021, which claims the benefit of priority of Chinese Patent Application No. 202111521722.8 filed on Dec. 13, 2021. The contents of the above applications are all incorporated by reference as if fully set forth herein in their entirety.

FIELD AND BACKGROUND OF THE INVENTION

The present disclosure relates to a display technology, and more particularly, to a display device.

An organic light emitting diode (OLED) display device is a display device having the best development potential because it has advantages, such as a low driving voltage, a high light emitting efficiency, a short response time, a high resolution and contrast, a wide usage temperature range, a near 180-degree view angle, a flexibility and a huge area full color display.

In order to ensure the assembly stability and the waterproof requirement of the OLED display device, in a conventional display device, a middle frame glue with a high viscosity is used to fix/stick the display panel and the middle frame of the display device. The middle frame glue has a better viscosity and a better fixing effect. However, the display panel has a back plate and a composite functional layer at a side facing the middle frame. In a dissembling (maintenance) process, the film layers may be separated or a folded edge may occur between the display panel and the back plate, between the back plate and the composite functional layer, or between film layers of the composite functional layer. In this way, the maintained display device may not be used anymore, the dissembling and maintenance yield is reduced, and the cost is enormously raised. This issue needs to be solved.

SUMMARY OF THE INVENTION

One objective of an embodiment of the present disclosure is to provide a display device, to solve the issue of separated layers and folded edges during the dissembling and/or maintenance process.

According to an embodiment of the present disclosure, a display device is disclosed. The display device comprises a display panel, a back plate positioned at a side of the display panel, and a composite functional layer positioned at a side of the back plate facing away the display panel. A micro structure is positioned at an edge of at least one of the display panel, the back plate and the composite functional layer.

Optionally, the display device further includes a light blocking ink layer, positioned at a side of the back plate facing away the composite functional layer. The light blocking ink layer includes a light blocking pattern, positioned correspondingly to the micro structure.

Optionally, a first micro structure is positioned on a side of the composite functional layer facing the back plate.

Optionally, the composite functional layer includes a supporting layer and a buffer layer, positioned between the supporting layer and the back plate. A second micro structure is positioned at an edge of the buffer layer facing the supporting layer.

Optionally, the back plate and the composite functional layer form a stacked layer structure, and a colloid covers at least one side edge of the stacked layer structure.

Optionally, the display panel comprises a substrate positioned adjacently to the back plate, at least one edge of the substrate protrudes the stacked layer structure, and the substrate protrudes the colloid covering the side edge of the stacked layer structure.

Optionally, a third micro structure is positioned at the edge of the substrate protruding the stacked layer structure, and the colloid covers the third micro structure.

Optionally, the micro structure comprises a plurality of grooves periodically-positioned, the grooves extend along a lengthwise direction of the edge.

Optionally, the edge comprises two first edges extending along a first direction and two second edges extending along a second direction perpendicular to the first direction, and the micro structure is positioned at the two first edges and at least one of the second edges.

Optionally, the first edge has a curved surface, and a distribution density of the micro structure on the first edge is greater than a distribution density of the micro structure on the second edge.

According to an embodiment of the present disclosure, a micro structure is positioned on at least one edge of the display panel, the back plate and the composite functional layer. This could increase the pinning effect and the adhesive effect between the display panel, the back plate and the composite functional layer to avoid the peeling phenomenon between the display panel, the back plate and the composite functional layer during the dissembling and maintenance process. Accordingly, the dissembling and maintenance yield of the display device is raised and the cost is reduced.

BRIEF DESCRIPTION OF THE SEVERAL VIEWS OF THE DRAWINGS

To describe the technical solutions in the embodiments of this application more clearly, the following briefly introduces the accompanying drawings required for describing the embodiments. Apparently, the accompanying drawings in the following description show merely some embodiments of this application, and a person of ordinary skill in the art may still derive other drawings from these accompanying drawings without creative efforts.

DESCRIPTION OF SPECIFIC EMBODIMENTS OF THE INVENTION

To help a person skilled in the art better understand the solutions of the present disclosure, the following clearly and completely describes the technical solutions in the embodiments of the present invention with reference to the accompanying drawings in the embodiments of the present invention. Apparently, the described embodiments are a part rather than all of the embodiments of the present invention. All other embodiments obtained by a person of ordinary skill in the art based on the embodiments of the present invention without creative efforts shall fall within the protection scope of the present disclosure.

The terminology used herein is for the purpose of describing particular embodiments only and is not intended to be limiting of the invention. As used herein, the singular forms "a", "said" and "the" are intended to include the plural forms as well, unless the context clearly indicates otherwise. It will be understood that the term "and/or," when used in this specification, specify one or more associated elements, alone or in combination, are provided. It will be further understood that the terms "first," "second," "third," and "fourth," when used in this specification, claim and drawings, are used to distinguish different objects, rather than to describe a specific order. It will be further understood that the terms "comprises" and/or "comprising," when used in this specification, specify the presence of stated features, products, steps, operations, elements, and/or components, but do not preclude the presence or addition of one or more other features, products, steps, operations, elements, components, and/or groups thereof.

The present disclosure provides a display device. The display device comprises a display panel, a back plate positioned at a side of the display panel, and a composite functional layer positioned at a side of the back plate facing away the display panel. A micro structure is positioned at an edge of at least one of the display panel, the back plate and the composite functional layer. This could increase the pinning effect and the adhesive effect between the display panel, the back plate and the composite functional layer to avoid the peeling phenomenon between the display panel, the back plate and the composite functional layer during the dissembling and maintenance process. Accordingly, the dissembling and maintenance yield of the display device is raised and the cost is reduced.

Embodiment 1

Figure 1:
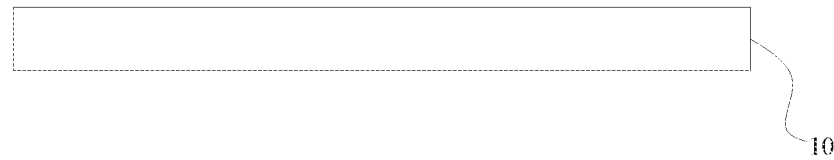
FIG. 1 is a diagram of a display device according to a first embodiment of the present disclosure.
Figure 2:
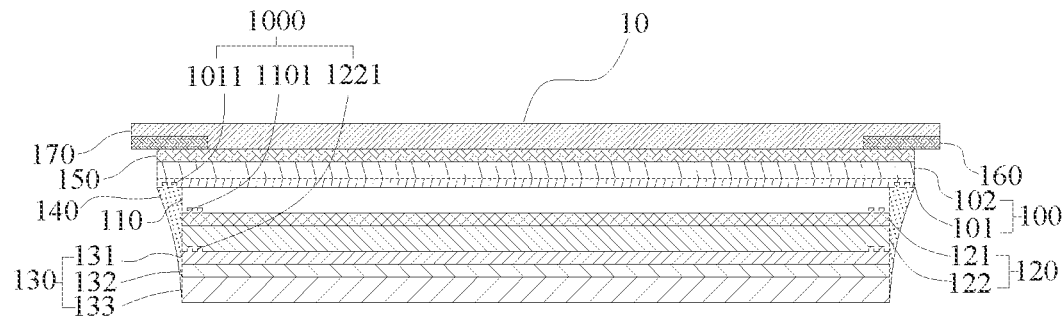
FIG. 2 is a diagram of a cross section of a partial film of the display device according to the first embodiment of the present disclosure.

Please refer to FIG. 1 and FIG. 2. FIG. 1 is a diagram of a display device according to a first embodiment of the present disclosure. FIG. 2 is a diagram of a cross section of a partial film of the display device according to the first embodiment of the present disclosure. The display device 10 could be a flat display device.

The display device 10 comprises a display panel 100. The display panel 100 is used to display an image. The display panel 100 could be an OLED display panel. Please note, the present disclosure does not limit the type of the display panel. In another embodiment, the display panel 100 could be an LCD display panel and an inorganic LED display panel.

The display panel 100 comprises a substrate 101 and a display panel main body 102 fixed on the substrate 101. The material of the substrate could be polyimide or polyethylene terephthalate (PET). The display panel main body 102 comprises a driving circuit layer and a pixel definition layer positioned above the driving circuit layer. A plurality of pixel definition openings are formed in an array on the pixel definition layer. Each of the pixel definition openings has an OLED device. The OLED device comprises a cathode, an anode and a light emitting unit between the cathode and the anode. In addition, a packaging layer is positioned on the OLED device to block the moisture and oxygen. The packaging layer could comprise stacked inorganic film layers and organic film layers.

The display device 10 further comprises a middle frame (not shown) for loading and protecting the display device 10. A middle frame glue (not shown) is positioned at a side of the middle frame facing the display panel 100. The middle frame glue could well fix the display panel to the middle frame and have the sealing, waterproof and dustproof effects. The middle frame glue arranged in the positions corresponding to the edge of the middle frame and the receiver.

The display device 10 comprises a back plate 110 fixedly positioned at one side of the display panel 100. The display panel 100 comprises a light emitting side and a backlight side. The back plate 110 is positioned at a backlight side of the display panel 100 between the display panel 100 and the display panel 100 and the middle frame.

The display device 10 comprises a composite functional layer. The composite functional layer is positioned at one side of back plate facing away the display panel 100. The composite functional layer is positioned between the back plate 100 and the middle frame and is fixed to the middle frame through the middle frame glue.

In order to effectively prevent the back plate 110 from being peeled off from the composite functionally layer, the edge of the back plate 100 has a micro structure 1000. The micro structure comprises periodically-positioned grooves. Specifically, the micro structure 1000 at the edge of the back plate 110 is the first micro structure 1101. The first micro structure 1101 comprises periodically-positioned grooves, where the grooves extend along the lengthwise direction.

The first micro structure 1101 is positioned at one side of the back plate 110 facing the composite functional layer. The composite functional layer comprises a first adhesive layer 121 adjacent to the back plate 110. The first adhesive 121 layer could fill up in the grooves of the first micro structure 1101. Therefore, the first micro structure 1101 could effectively increases the surface roughness of the edge of a side of the back plate 110 facing the composite functional layer, increase the adhesion area between the back plate 110 and the composite functional layer, strengthen the pinning effect between the back plate 110 and the composite functional layer, raise the adhesive effect between the back plate 110 and the composite function layer, prevent the back plate 110 from being peeled off from the composite functional layer when the display device 10 is being assembled and maintained, reduce the occurrence possibility off the folded edge, raise the maintenance yield of the display device 10, and reduce the cost.

The depth of the grooves in the first micro structure 1101 is greater than 0 micron but smaller or equal to 10 microns.

The edge of the back plate 110 comprises two first edges extending along the first direction and two second edges extending along the second direction perpendicular to the first direction. The first micro structure 1101 is positioned at the two first edges and at least one of the two second edges. Preferably, the length of the first edges is greater than the length of the second edges. The display device 10 further comprises an integrated circuit (IC) positioned between the middle frame and the composite functional layer and there is no middle frame glue positioned between the IC and the middle frame. Here, the IC is positioned correspondingly to one of the two second edges of the back plate. The first micro structure 1101 is not positioned on the second edge of the back plate 110 corresponding to the IC.

The composite functional layer comprises stacked multiple film layers. In order to prevent from the peeling effect of the multiple film layers during the dissembling process, the edge of the composite function layer has the micro structure 1000. The micro structure 1000 comprises periodically-positioned grooves. The micro structure 1000 positioned at the edge of the composite functional layer is the second micro structure 1221. The second micro structure 1221 comprises periodically-positioned grooves. The grooves extend along the edge direction.

The composite functional layer comprises a buffer layer 120 and a supporting layer 130. The buffer layer 120 is positioned between the supporting layer 130 and the back plate 110. The buffer layer 120 could have a buffer effect for the display panel 100 to raise the stability of the display device. The buffer layer 120 comprises a first adhesive layer 121 and a foam material layer 122 positioned between the first adhesive layer 121 and the supporting layer 130. The first adhesive layer 121 is stably connected the foam material layer 122 to the back plate 110. The supporting layer 130 is used to support the display panel 100 to raise the rigidity of the display device 10. The supporting layer 130 comprises a second adhesive layer 131, a polyimide layer 132 and a metal layer 133. The second adhesive layer 131 and the buffer layer 120 are adjacently positioned. The metal layer 133 and the middle frame glue are adjacently positioned. The metal layer 133 is a metal copper foil or a nickel-iron alloy. The polyimide layer 132 is positioned between the second adhesive 131 and the metal layer 133.

The second micro structure 1221 is positioned at one edge of the buffer layer 120 facing the supporting layer 130. Because the second adhesive layer 131 and the foam material layer 122 of the supporting layer 130 are adjacently positioned such that the second adhesive layer 131 could be filled up in the grooves of the second micro structure 1221. Therefore, the second micro structure 1221 could effectively increases the surface roughness of the edge of a side of the buffer layer 120 facing the supporting layer 130, increase the adhesion area between the buffer layer 120 and the supporting layer 130, strengthen the pinning effect between the buffer layer 120 and the supporting layer 130, raise the adhesive effect between the buffer layer 120 and the supporting layer 130, prevent the buffer layer 120 from being peeled off from the supporting layer 130 when the display device 10 is being assembled and maintained, reduce the occurrence possibility off the folded edge, raise the maintenance yield of the display device 10, and reduce the cost.

The depth of the grooves in the second micro structure 1221 is greater than 0 micron but smaller or equal to 10 microns.

The edge of the back plate 110 comprises two first edges extending along the first direction and two second edges extending along the second direction perpendicular to the first direction. The first micro structure 1101 is positioned at the two first edges and at least one of the two second edges. Preferably, the length of the first edges is greater than the length of the second edges. The display device 10 further comprises an integrated circuit (IC) positioned between the middle frame and the composite functional layer and there is no middle frame glue positioned between the IC and the middle frame. Here, the IC is positioned correspondingly to one of the two second edges of the back plate. The second micro structure 1221 is not positioned on the second edge of the back plate 110 corresponding to the IC.

The back plate 110 and the composite functional layer form a stacked structure. At least one side edge of the stacked structure is covered by a colloid 140. The width of the colloid 140 is smaller than or equal to 20 mm. The colloid 140 could stabilize the stacked structure formed by the back plate 110 and the composite functional layer to further reduce the occurrence possibility of peeling the back plate off from the composite functional layer, raise the maintenance yield of the display device 10, and reduce the cost.

At least one edge of the substrate 101 of the display panel 100 protrudes the stacked structure. The edge of the substrate 101 protruding the stacked structure is covered by the colloid 140. The colloid 140 could stably combine the stacked structure with the display panel 100 to further reduce the occurrence possibility of peeling the display panel 100 off from the stacked structure, raise the maintenance yield of the display device 10, and reduce the cost.

In order to further reduce the occurrence possibility of peeling the display panel 100 off from the stacked structure, an edge of the display panel 100 has a micro structure 1000. The micro structure 1000 comprises periodically-positioned grooves. The micro structure 1000 positioned at the edge of the display panel 100 is the third micro structure 1011. The third micro structure 1011 is positioned at one side edge of the substrate 101 facing the back plate 110. The third micro structure 1011 comprises periodically-positioned grooves. The grooves extend along the lengthwise direction of the edge.

Because the colloid 140 covers the edge of the substrate 101 protruding the stacked structure, the colloid 140 is filled up in the grooves of the third micro structure 1011. Therefore, the third micro structure 1011 could effectively increases the surface roughness of the edge of a side of the display panel 100 facing the back plate 110, increase the adhesion area between the display panel 100 and the stacked structure, strengthen the pinning effect between the display panel 100 and the stacked structure, raise the adhesive effect between the display panel 100 and the stacked structure, prevent the display panel 100 from being peeled off from the back plate 110 when the display device 10 is being assembled and maintained, reduce the occurrence possibility off the folded edge, raise the maintenance yield of the display device 10, and reduce the cost.

The depth of the grooves of the third micro structure 1011 is greater than 0 micron but smaller or equal to 10 microns.

The edge of the display panel 100 comprises two first edges extending along the first direction and two second edges extending along the second direction perpendicular to the first direction. The third micro structure 1011 is positioned at the two first edges and at least one of the two second edges. Preferably, the length of the first edges is greater than the length of the second edges. The display device 10 further comprises an integrated circuit (IC) positioned between the middle frame and the composite functional layer and there is no middle frame glue positioned between the IC and the middle frame. Here, the IC is positioned correspondingly to one of the two second edges of the back plate. The third micro structure 1011 is not positioned on the second edge of the display panel 100 corresponding to the IC.

The display device 10 further comprises a light blocking ink layer 160. The light blocking ink layer is positioned at one side of the back plate 110 facing away composite functional layer. Here, the light blocking ink layer 160 comprises a light blocking pattern. The light blocking pattern is positioned correspondingly to the micro structure 1000. Because the light blocking pattern is positioned correspondingly to the micro structure 1000, it could effectively avoid the display quality reduction due to the scattering and refraction when the light reaches the micro structure 1000.

In addition, a polarizer 150 and a cover plate 170 are stacked and positioned on a side of the display panel 100 facing away the back plate 110. The polarizer 150 is used to reduce the light generated by reflecting the ambient light from the display device 10 and raise the display effect of the display device 10. Surely, the polarizer 150 is not a limitation of the present disclosure. There are some other types of optical film layers that could be used to reduce the reflected light. In another embodiment, the polarizer 150 could be replaced with a color filter. The cover plate 170 is used to protect the display panel 100 and could be a flexible cover plate made with a super thin glass or an organic material. The light blocking ink layer 160 could be positioned between the cover plate 170 and the polarizer 150.

The micro structure 1000 comprises a first micro structure 1101 positioned at an edge of the back plate 110, a second micro structure 1221 positioned at an edge of the composite functional layer, and a third micro structure 1011 positioned at an edge of the display panel 100. The first micro structure 1101, the second micro structure 1221 and the third micro structure 1101 all comprise periodically-positioned grooves, extending along the lengthwise direction of the edges. The arrangements of the grooves in the first micro structure 1101, the second micro structure 1221 and the third micro structure 1101 could be the same or different. Preferably, the arrangements of the grooves in the first micro structure 1101, the second micro structure 1221 and the third micro structure 1101 are similar or identical. In the following embodiment, the first micro structure 1101 is taken as an example to illustrate the arrangement of the grooves in the micro structure 1000.

Figure 3:
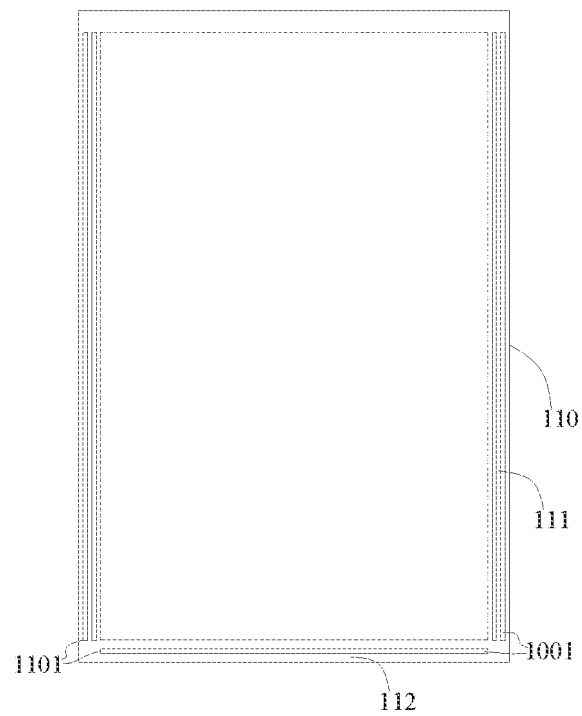
FIG. 3 is a diagram showing a distribution of a first micro structure on the back plate according to the first embodiment of the present disclosure.

Please refer to FIG. 3. FIG. 3 is a diagram showing a distribution of the first micro structure on the back plate according to the first embodiment of the present disclosure. The first micro structure 1101 on the edge of the back plate 110 comprises periodically-positioned grooves 1001. The grooves 1001 extend along the lengthwise direction of the edge. The cross section of the groove 1001 could be in a shape of round or triangle.

The shape of the back plate 110 is rectangular. The edge of the back plate 110 comprises two oppositely-positioned first edges 111 and two oppositely-positioned second edges 112. The length of the first edge 111 is greater than the length of the second edge 112. The first edge 111 extends along the first direction. The second edge 112 extends along the second direction. The first direction is perpendicular to the second direction. The first micro structure 1101 comprises a plurality of groove sets positioned at each first edge 111. Each groove set comprises at least one groove 1001. The first micro structure 1101 further comprises at least one groove set positioned on the second edge 112. Each groove set comprises at least one groove 1001. There is no groove set on the other second edge 112. The second edge 112 without any groove set corresponds to the bonding region of the display device. The IC is positioned on the bonding region.

In addition, two groove sets are positioned on each of the first edges of the back plate 110. Each groove set comprises one groove 101. One groove set is positioned on one second edge 112. The groove set comprises one groove 1001. The other second edge does not have any groove set on it.

Preferably, the distribution of the grooves 1001 in the second micro structure 1221 and the third micro structure 1011 is the same as that of the first micro structure 1001. This arrangement could avoid respectively adopting different micro structures 1000 on the display panel 100, the back plate 110 and the composite functional layer and thus reduce the manufacturing complexity.

Embodiment 2

Figure 4:
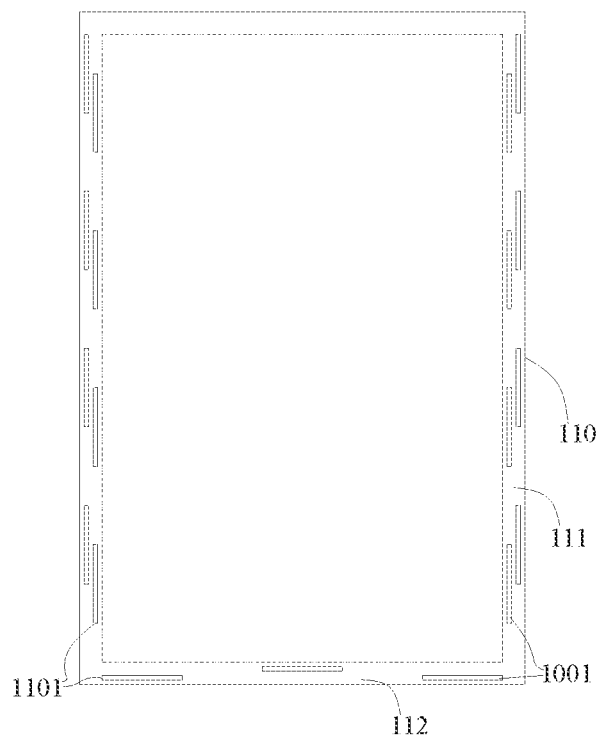
FIG. 4 is a diagram showing a distribution of a first micro structure on the back plate according to a second embodiment of the present disclosure.

Please refer to FIG. 4. FIG. 4 is a diagram showing a distribution of the first micro structure on the back plate according to a second embodiment of the present disclosure. Unlike the structure shown in FIG. 2, in the second embodiment, the distribution of the grooves 1001 in the micro structure 1000 on the display panel 100, the back plate 110 and the composite functional layer is different.

The micro structure 1000 comprises a first micro structure 1101 positioned at an edge of the back plate 110, a second micro structure 1221 positioned at an edge of the composite functional layer, and a third micro structure 1011 positioned at an edge of the display panel 100. The grooves 1001 in the first micro structure 1101, the second micro structure 1221 and the third micro structure 1011 have the same structure.

In the following embodiment, the first micro structure 1101 is taken as an example to illustrate the arrangement of the grooves in the micro structure 1000.

The first micro structure 1101 comprises a plurality of groove sets positioned at each first edge 111. Each groove set comprises periodically-positioned grooves 1001. The grooves 1001 on the two first edges 111 are symmetrically positioned. The grooves 1001 in each groove set have displacements with the grooves 1001 in another groove set of an adjacent column. Each groove 1001 has the same size. The first micro structure 1101 further comprises a plurality of groove sets positioned on one of the second edges 112. Each groove set comprises at least one groove 1001. The groove 1001 in the groove set has a displacement with the grooves 1001 in an adjacent groove set of an adjacent row. There is no groove set on the other second edge 112.

In the display device 10 of the second embodiment, because the first micro structure 1101 on the back plate 110 comprises more periodically-positioned grooves 1001 and the distribution of the grooves 1001 is more complex, this could further increase the adhesion area between the back plate 110 and the composite functional layer, strengthen the pinning effect between the back plate 110 and the composite functional layer, raise the adhesive effect between the back plate 110 and the composite functional layer, prevent the back plate 110 from being peeled off from the composite functional layer when the display device 10 is being assembled and maintained, reduce the occurrence possibility off the folded edge, raise the maintenance yield of the display device 10, and reduce the cost.

Accordingly, the distribution of the grooves 1001 in the second micro structure 1221 and the third micro structure 1011 are similar to the distribution of the grooves 1001 in the first micro structure 1101. Further illustrations are omitted for simplicity.

Embodiment 3

Figure 5:
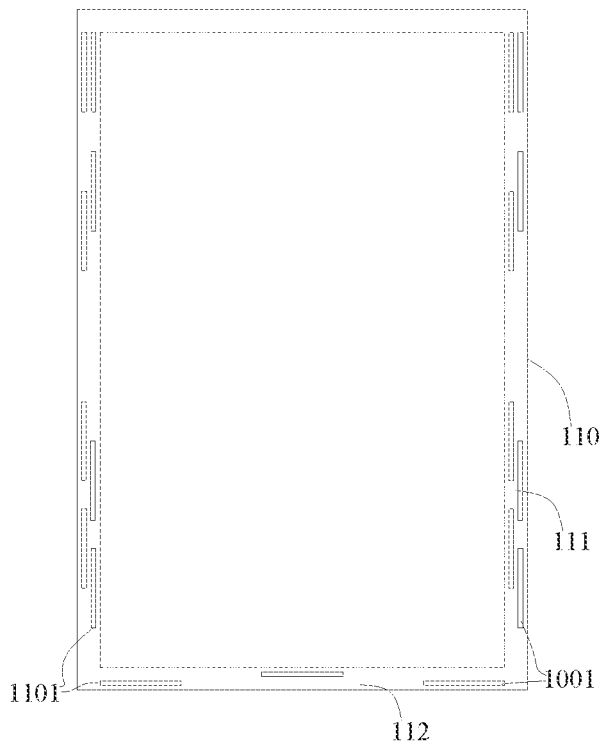
FIG. 5 is a diagram showing a distribution of a first micro structure on the back plate according to a third embodiment of the present disclosure.

Please refer to FIG. 5. FIG. 5 is a diagram showing a distribution of the first micro structure on the back plate according to a third embodiment of the present disclosure. Unlike the structure shown in FIG. 2, in the third embodiment, the distribution of the grooves 1001 in the micro structure 1000 on the display panel 100, the back plate 110 and the composite functional layer is different.

The micro structure 1000 comprises a first micro structure 1101 positioned at an edge of the back plate 110, a second micro structure 1221 positioned at an edge of the composite functional layer, and a third micro structure 1011 positioned at an edge of the display panel 100. The grooves 1001 in the first micro structure 1101, the second micro structure 1221 and the third micro structure 1011 have the same structure.

In the following embodiment, the first micro structure 1101 is taken as an example to illustrate the arrangement of the grooves in the micro structure 1000.

The first micro structure 1101 comprises a plurality of groove sets positioned at each first edge 111. Each groove set comprises periodically-positioned grooves 1001. The grooves 1001 on the two first edges 111 are positioned in an array. The distances between two grooves in each groove set is different. In addition, the grooves in a groove set have displacements with the grooves 1001 in another groove set of an adjacent column. Each groove 1001 has the same size. The first micro structure 1101 further comprises a plurality of groove sets positioned on one of the second edges 112. Each groove set comprises at least one groove 1001. The groove 1001 in the groove set has a displacement with the grooves 1001 in an adjacent groove set of an adjacent row. There is no groove set on the other second edge 112.

In the display device 10 of the third embodiment, because the first micro structure 1101 on the back plate 110 comprises more periodically-positioned grooves 1001 and the distribution of the grooves 1001 is more complex, this could further increase the adhesion area between the back plate 110 and the composite functional layer, strengthen the pinning effect between the back plate 110 and the composite functional layer, raise the adhesive effect between the back plate 110 and the composite functional layer, prevent the back plate 110 from being peeled off from the composite functional layer when the display device 10 is being assembled and maintained, reduce the occurrence possibility off the folded edge, raise the maintenance yield of the display device 10, and reduce the cost.

Accordingly, the distribution of the grooves 1001 in the second micro structure 1221 and the third micro structure 1011 are similar to the distribution of the grooves 1001 in the first micro structure 1101. Further illustrations are omitted for simplicity.

Embodiment 4

Figure 6:
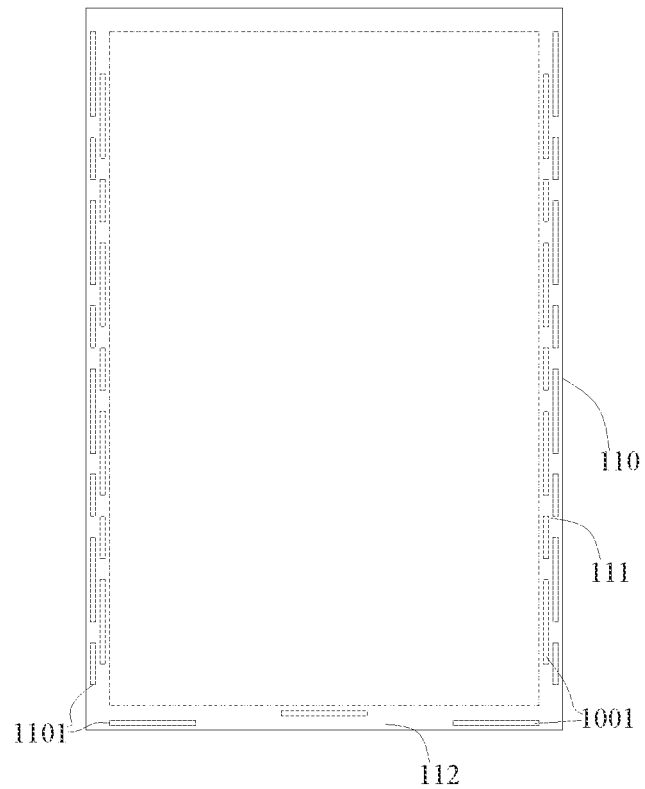
FIG. 6 is a diagram showing a distribution of a first micro structure on the back plate according to a third embodiment of the present disclosure.

Please refer to FIG. 6. FIG. 6 is a diagram showing a distribution of a first micro structure on the back plate according to a third embodiment of the present disclosure. Unlike the structure shown in FIG. 2, in the fourth embodiment, the distribution of the grooves 1001 in the micro structure 1000 on the display panel 100, the back plate 110 and the composite functional layer is different.

The micro structure 1000 comprises a first micro structure 1101 positioned at an edge of the back plate 110, a second micro structure 1221 positioned at an edge of the composite functional layer, and a third micro structure 1011 positioned at an edge of the display panel 100. The grooves 1001 in the first micro structure 1101, the second micro structure 1221 and the third micro structure 1011 have the same structure.

In the following embodiment, the first micro structure 1101 is taken as an example to illustrate the arrangement of the grooves in the micro structure 1000.

The first micro structure 1101 comprises a plurality of groove sets positioned at each first edge 111. Each groove set comprises periodically-positioned grooves 1001. The grooves 1001 on the two first edges 111 are symmetrically positioned. The adjacent grooves 1001 in each groove set have different sizes. In addition, the grooves in a groove set have displacements with the grooves 1001 in another groove set of an adjacent column. The first micro structure 1101 further comprises a plurality of groove sets positioned on one of the second edges 112. Each groove set comprises at least one groove 1001. The groove 1001 in the groove set has a displacement with the grooves 1001 in an adjacent groove set of an adjacent row. There is no groove set on the other second edge 112.

In the display device 10 of the third embodiment, because the first micro structure 1101 on the back plate 110 comprises more periodically-positioned grooves 1001 and the distribution of the grooves 1001 is more complex, this could further increase the adhesion area between the back plate 110 and the composite functional layer, strengthen the pinning effect between the back plate 110 and the composite functional layer, raise the adhesive effect between the back plate 110 and the composite functional layer, prevent the back plate 110 from being peeled off from the composite functional layer when the display device 10 is being assembled and maintained, reduce the occurrence possibility off the folded edge, raise the maintenance yield of the display device 10, and reduce the cost.

Accordingly, the distribution of the grooves 1001 in the second micro structure 1221 and the third micro structure 1011 are similar to the distribution of the grooves 1001 in the first micro structure 1101. Further illustrations are omitted for simplicity.

Embodiment 5

Figure 7:
FIG. 7 is a diagram of a display device according to a fifth embodiment of the present disclosure.
Figure 8:
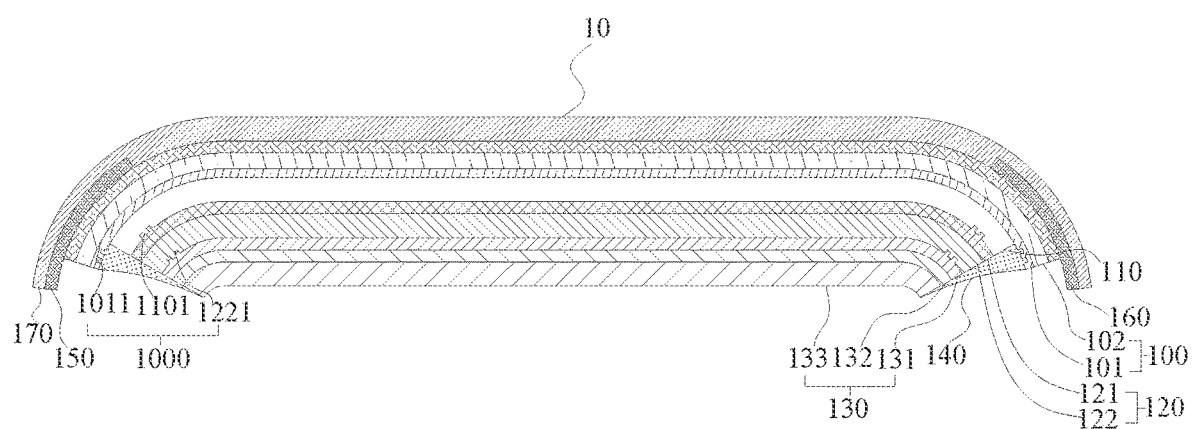
FIG. 8 is a diagram of a cross section of a partial film of the display device according to the fifth embodiment of the present disclosure.

Please refer to FIG. 7 and FIG. 8. FIG. 7 is a diagram of a display device according to a fifth embodiment of the present disclosure. FIG. 8 is a diagram of a cross section of a partial film of the display device according to the fifth embodiment of the present disclosure. As shown in FIG. 3 to FIG. 8, a display device 10 is disclosed. The display device 10 could be a curved display device. The curved display device comprises a double-curved-surface display device or a quadruple-curved-surface display device.

The display device 10 of the fifth embodiment is similar to the display device 10 of the first embodiment to the fourth embodiment. The display device 10 of the fifth embodiment comprises a similar film layer structure. The arrangement of the grooves in the micro structure 1000 could be any one of the arrangement in the first to the fourth embodiments. Further illustration is omitted here for simplicity.

If the display device 10 is a quadruple-curved-surface display device, the two first edges 111 and the two second edges 112 of the back plate all have a curved surface. The two first edges 111 and the two second edges 112 of the composite functional layer all have a curved surface. The two first edges 111 and the two second edges 112 of the display panel 100 all have a curved surface.

Preferably, the display device 10 is a double-curved-surface display device. In the following embodiment, the first micro structure 1101 is taken as an example for illustrating the arrangement of the grooves 1001 in the micro structure 1000.

The first edge 111 has a curved surface and the second edge 112 has a flat surface. The distribution density of the first micro structure 1101 on the first edge 111 is greater than a distribution density of the micro structure 1101 on the second edge 112. That is, the groove-to-all-area ratio on the first edge 111 is greater than the groove-to-all-area ratio on the second edge 112. Because the groove-to-all-area ratio on the first edge 111, having a curved surface, is greater, it is more rare for the peeling phenomenon between the back plate 110 and the composite functional layer 110 at the first edge. This could reduce the occurrence possibility off the folded edge, raise the maintenance yield of the display device 10, and reduce the cost.

The distribution of the grooves 1001 in the second micro structure 1221 and the third micro structure 1011 are similar to the distribution of the grooves 1001 in the first micro structure 1101. Further illustrations are omitted for simplicity.

From the above, according to an embodiment of the present disclosure, a micro structure is positioned on at least one edge of the display panel, the back plate and the composite functional layer. This could increase the pinning effect and the adhesive effect between the display panel, the back plate and the composite functional layer to avoid the peeling phenomenon between the display panel, the back plate and the composite functional layer during the dissembling and maintenance process. Accordingly, the dissembling and maintenance yield of the display device is raised and the cost is reduced.

Above are embodiments of the present disclosure, which does not limit the scope of the present disclosure. Any modifications, equivalent replacements or improvements within the spirit and principles of the embodiment described above should be covered by the protected scope of the disclosure.

What is claimed is:

1. A display device, comprising:
a display panel;
a back plate, positioned at a side of the display panel; and
a composite functional layer, positioned at a side of the back plate facing away the display panel;
wherein a micro structure is positioned at an edge of at least one of the display panel, the back plate and the composite functional layer;
the edge comprises two first edges extending along a first direction and two second edges extending along a second direction perpendicular to the first direction, and the micro structure is positioned at the two first edges and at least one of the second edges.

2. The display device of claim 1, further comprising:
a light blocking ink layer, positioned at a side of the back plate facing away the composite functional layer, the light blocking ink layer comprising:
a light blocking pattern, positioned correspondingly to the micro structure.

3. The display device of claim 1, wherein a first micro structure is positioned on a side of the back plate facing the composite functional layer.

4. The display device of claim 3, wherein the composite functional layer comprises:

a supporting layer; and
a buffer layer, positioned between the supporting layer and the back plate;
wherein a second micro structure is positioned at an edge of the buffer layer facing the supporting layer.

5. The display device of claim 4, wherein the back plate and the composite functional layer form a stacked layer structure, and a colloid covers at least one side edge of the stacked layer structure.

6. The display device of claim 5, wherein the display panel comprises a substrate positioned adjacently to the back plate, at least one edge of the substrate protrudes the stacked layer structure, and the substrate protrudes the colloid covering the side edge of the stacked layer structure.

7. The display device of claim 6, wherein a third micro structure is positioned at the edge of the substrate protruding the stacked layer structure, and the colloid covers the third micro structure.

8. The display device of claim 1, wherein the micro structure comprises a plurality of grooves periodically-positioned, the grooves extend along a lengthwise direction of the edge.

9. The display device of claim 1, wherein the first edge has a curved surface, and a distribution density of the micro structure on the first edge is greater than a distribution density of the micro structure on the second edge.

10. A display device, comprising:
a display panel;
a back plate, positioned at a side of the display panel; and
a composite functional layer, positioned at a side of the back plate facing away the display panel;
wherein a micro structure is positioned at an edge of at least one of the display panel, the back plate and the composite functional layer;
the display device further comprises a middle frame, positioned at one side of the composite functional layer facing away the back plate; and
a middle frame glue is positioned between the middle frame and the composite functional layer, and the middle frame is fixedly connected to the composite functional layer through the middle frame glue.

11. The display device of claim 10, further comprising:
a light blocking ink layer, positioned at a side of the back plate facing away the composite functional layer, the light blocking ink layer comprising:
a light blocking pattern, positioned correspondingly to the micro structure.

12. The display device of claim 10, wherein a first micro structure is positioned on a side of the composite functional layer facing the back plate.

13. The display device of claim 12, wherein the composite functional layer comprises:
a supporting layer; and
a buffer layer, positioned between the supporting layer and the back plate;
wherein a second micro structure is positioned at an edge of the buffer layer facing the supporting layer.

14. The display device of claim 13, wherein the back plate and the composite functional layer form a stacked layer structure, and a colloid covers at least one side edge of the stacked layer structure.

15. The display device of claim 14, wherein the display panel comprises a substrate positioned adjacently to the back plate, at least one edge of the substrate protrudes the stacked layer structure, and the substrate protrudes the colloid covering the side edge of the stacked layer structure.

16. The display device of claim 15, wherein a third micro structure is positioned at the edge of the substrate protruding the stacked layer structure, and the colloid covers the third micro structure.

17. The display device of claim 10, wherein the micro structure comprises a plurality of grooves periodically-positioned, the grooves extend along a lengthwise direction of the edge.

18. The display device of claim 10, wherein the edge comprises two first edges extending along a first direction and two second edges extending along a second direction perpendicular to the first direction, and the micro structure is positioned at the two first edges and at least one of the second edges.

19. The display device of claim 18, wherein the first edge has a curved surface, and a distribution density of the micro structure on the first edge is greater than a distribution density of the micro structure on the second edge.

* * * * *